(12) United States Patent
Hekmatshoartabari et al.

(10) Patent No.: US 9,391,094 B2
(45) Date of Patent: Jul. 12, 2016

(54) THIN-FILM AMBIPOLAR LOGIC

(71) Applicant: International Business Machines Corporation, Armonk, NY (US)

(72) Inventors: Bahman Hekmatshoartabari, White Plains, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/825,271

(22) Filed: Aug. 13, 2015

(65) Prior Publication Data

US 2015/0380523 A1    Dec. 31, 2015

Related U.S. Application Data

(62) Division of application No. 14/318,846, filed on Jun. 30, 2014.

(51) Int. Cl.
| | |
|---|---|
| *H01L 29/66* | (2006.01) |
| *H01L 27/12* | (2006.01) |
| *H01L 21/762* | (2006.01) |
| *H01L 21/285* | (2006.01) |

(Continued)

(52) U.S. Cl.
CPC ........ *H01L 27/1222* (2013.01); *H01L 21/2855* (2013.01); *H01L 21/76251* (2013.01); *H01L 27/1259* (2013.01); *H01L 29/45* (2013.01); *H01L 29/66742* (2013.01); *H01L 29/66772* (2013.01); *H01L 29/78654* (2013.01)

(58) Field of Classification Search
CPC ............ H01L 51/0545; H01L 51/0036; H01L 51/0562
USPC ............. 257/40, E51.001, E51.005, E51.025, 257/E29.242, E21.414; 438/99, 151, 22
See application file for complete search history.

(56) References Cited

U.S. PATENT DOCUMENTS

| 7,652,339 B2 | 1/2010 | Wu et al. |
| 8,354,695 B2 | 1/2013 | Bhuwalka et al. |
| 8,563,974 B2 | 10/2013 | Liu et al. |

(Continued)

OTHER PUBLICATIONS

Chan et al., "Ambipolar microcrystalline silicon transistors and inverters," Solid-State Electronics 53, pp. 635-639, © 2009 Elsevier Ltd., D.O.I. 10.1016/j.sse.2009.04.002.
Jang et al., "Ambipolarity Factor of Tunneling Field-Effect Transistors (TFETs)," Journal of Semiconductor Technology and Science, Dec. 2011, pp. 272-277, vol. 11, Issue 4, D.O.I. 10.5573/JSTS.2011. 11.4.272.

(Continued)

*Primary Examiner* — David Vu
*Assistant Examiner* — Jonathan Han
(74) *Attorney, Agent, or Firm* — Louis J. Percello; Nicholas D. Bowman

(57) ABSTRACT

An ambipolar electronic device is disclosed. The device may include a field-effect transistor (FET), which may have a handle substrate layer, two contacts and an inorganic crystalline layer between the handle substrate layer and the contacts. The inorganic crystalline layer may have a doped channel region between the contacts. The FET may also have a dielectric layer between the contacts, attached to the inorganic crystalline layer, and a gate layer, attached to the dielectric layer. The FET may conduct current, in response to a first gate voltage applied to the gate layer, using electrons as a majority carrier, along the length of the channel region between the contacts. The FET may also conduct current, in response to a second gate voltage applied to the gate layer, using holes as a majority carrier, along the length of the channel region between the contacts.

5 Claims, 6 Drawing Sheets

(51) Int. Cl.
*H01L 29/45* (2006.01)
*H01L 29/786* (2006.01)

(56) References Cited

U.S. PATENT DOCUMENTS

| | | | | |
|---|---|---|---|---|
| 2010/0237352 | A1* | 9/2010 | Sele | H01L 27/12 257/66 |
| 2012/0018706 | A1* | 1/2012 | Kagan | H01L 51/0558 257/40 |
| 2012/0105046 | A1* | 5/2012 | Marshall | H01L 29/78684 323/315 |
| 2013/0153864 | A1 | 6/2013 | Sung et al. | |
| 2013/0153903 | A1 | 6/2013 | Sung et al. | |
| 2014/0183530 | A1* | 7/2014 | Yamazaki | H01L 29/7869 257/43 |
| 2014/0326994 | A1* | 11/2014 | Tanaka | H01L 29/7869 257/43 |

OTHER PUBLICATIONS

Narang et al., "Assessment of Ambipolar Behavior of a Tunnel FET and Influence of Structural Modifications," Journal of Semiconductor Technology and Science, Dec. 2012, pp. 482-491, vol. 12, Issue 4, D.O.I. 10.5573/JSTS.2012.12.4.482.

Subramaniam et al., "Submicron Ambipolar Nanocrystalline Silicon Thin-Film Transistors and Inverters," IEEE Transactions on Electron Devices, Feb. 2012, pp. 359-366, vol. 59, Issue 2, © 2011 IEEE D.O.I. 10.1109/TED.2011.2176737.

Turkyilmaz et al., "Self-Checking Ripple-Carry Adder with Ambipolar Silicon Nano Wire FET," 2013 IEEE International Symposium on Circuits and Systems, May 19-23, 2013, pp. 2127-2130, Beijing, China, © 2013 IEEE D.O.I. 10.1109/ISCAS.2013.6572294.

Hekmatshoartabari, B. et al., "Thin-Film Ambipolar Logic," U.S. Appl. No. 14/318,846, filed Jun. 30, 2014.

IBM, "List of IBM Patents or Patent Applications Treated as Related," Aug. 12, 2015, 2 pages.

* cited by examiner

THIN-FILM AMBIPOLAR LOGIC

BACKGROUND

The present disclosure generally relates to field-effect transistors (FETs). In particular, this disclosure relates to FETs fabricated from thin-film inorganic crystalline layers and that have ambipolar properties.

A field-effect transistor (FET) may generally be a transistor that uses an electric field to control the shape and hence the conductivity of a channel of one type of charge carrier in a semiconductor material. FETs may be unipolar transistors as they may involve single-carrier-type operation. FETs may be majority-charge-carrier devices, in which the current is carried predominantly by majority carriers. A FET device may consist of an active channel through which charge carriers, electrons or holes, flow from a source to a drain. Source and drain terminal conductors may be connected to the semiconductor through ohmic contacts. The conductivity of the channel may be a function of the electric potential applied across the gate and source terminals.

Complementary metal-oxide-semiconductor (CMOS) is a term which may refer to both a digital circuit design style and a corresponding family of processes used to implement that style of circuitry in the fabrication of integrated circuits (chips). A digital design style including CMOS technology may use complementary and symmetrical pairs of P-type and N-type metal oxide semiconductor field-effect transistors (MOSFETs) connected together to form circuits that may perform logical functions. The phrase "metal-oxide-semiconductor" may refer to the physical structure of certain field-effect transistors (FETs), having an electrically conductive gate electrode placed on top of an oxide insulator, which in turn is formed on top of a semiconductor material.

CMOS technology may be used in microprocessors, microcontrollers, static random-access memory (SRAM), and other types of digital logic circuits. CMOS technology may also be used for various types of analog circuits such as image sensors, data converters, and integrated communication transceivers. Commercial CMOS products may include integrated circuits composed of billions of transistors of both P and N types, integrated and interconnected on a rectangular silicon die.

SUMMARY

Various aspects of the present disclosure may be useful for providing low-cost, structurally flexible ambipolar field-effect transistor (FET) devices for use in large area electronic applications such as displays, sensors and smart user interfaces. An electronic device configured according to embodiments of the present disclosure may have lower cost, more robust performance, and simplified manufacturing relative to other technologies used in the fabrication of large area electronic devices.

Embodiments may be directed towards an ambipolar electronic device. The ambipolar electronic device may include a first field-effect transistor (FET). The first FET may have a handle substrate layer, a first contact, a second contact, and an inorganic crystalline layer formed between a top surface of the handle substrate layer and the first and second contacts. The inorganic crystalline layer may have a doped channel region with a length extending between the first contact and the second contact. The first FET may also have a dielectric layer attached, between the first contact and the second contact, to a top surface of the inorganic crystalline layer, and may have a gate layer, attached to a top surface of the dielectric layer. The first FET may be configured to conduct current, in response to a first gate voltage applied to the gate layer and using electrons as a majority carrier, along the length of the channel region between the first contact and the second contact. The first FET may also be configured to conduct current, in response to a second gate voltage applied to the gate layer and using holes as a majority carrier, along the length of the channel region between the first contact and the second contact.

Embodiments may also be directed towards an ambipolar electronic device. The ambipolar electronic device may include a first field-effect transistor (FET). The a first FET may have a buried insulator layer attached to a top surface of handle substrate layer, a first contact, a second contact, and an inorganic crystalline layer formed between a top surface of the buried insulator layer and the first and second contacts. The inorganic crystalline layer may also have a doped channel region with a length extending between the first contact and the second contact. The first FET may also have an insulating layer attached, between the first contact and the second contact, to a top surface of the inorganic crystalline layer, and may have metallic layer formed below a bottom surface of the buried insulator layer. The first FET may be configured to conduct current, in response to a first gate voltage applied to the metallic layer and using electrons as a majority carrier, along the length of the channel region between the first contact and the second contact. The first FET may also be configured to conduct current, in response to a second gate voltage applied to the metallic layer and using holes as a majority carrier, along the length of the channel region between the first contact and the second contact.

Embodiments may also be directed towards a method for manufacturing an ambipolar field-effect transistor (FET) device. The method may include forming a buried insulator layer on a handle substrate layer, forming an inorganic crystalline layer on the buried insulator layer, and depositing a metallic layer on a bottom surface of the handle substrate layer. The method may also include forming a first electrically conductive contact and a second electrically conductive contact on a top surface of the inorganic crystalline layer, depositing a dielectric layer on a top surface of the inorganic crystalline layer, and depositing an electrically conductive material between the first electrically conductive contact and the second electrically conductive contact, to form a metal layer. The metal layer may be configured to function as a gate of the ambipolar FET by causing, in response to a first gate voltage and using electrons as a majority carrier, current to be conducted, along a length of a channel region between a first contact and a second contact. The metal layer may also be configured to function as a gate of the ambipolar FET by causing, in response to a second gate voltage and using holes as a majority carrier, current to be conducted, along the length of the channel region between the first contact and the second contact.

Aspects of the various embodiments may be used to limit power consumption, limit cost and enhance the performance of electronic devices used in large area and wearable electronics applications. Aspects of the various embodiments may also be useful for providing electronic switching devices for use with large area electronic applications that are stable over time, environmental conditions and operational conditions, by using existing and proven crystalline silicon FET fabrication processes, and thin-film layer removal and bonding technologies.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
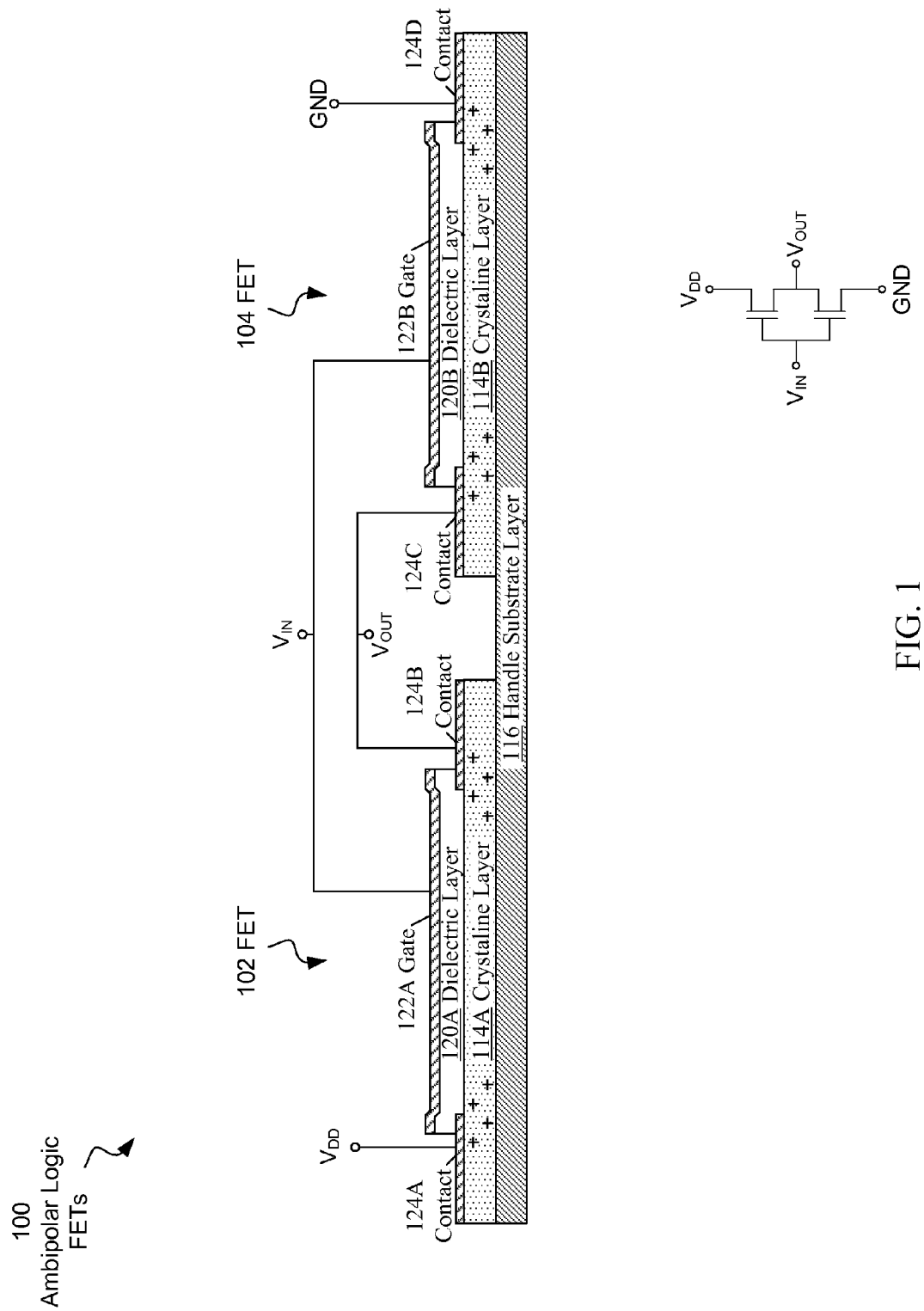
FIG. 1 depicts a cross-sectional view of two ambipolar field-effect transistors (FETs) formed on a handle substrate layer and configured to be controlled by a gate voltage applied to a gate layer, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing structurally flexible, cost-effective ambipolar field-effect transistor (FET) devices to "large area" electronic devices such as displays and sensors which may be used to provide interaction between electronic devices and device users. Such electronic devices may include, but are not limited to laptop computers, e-books and scanners. While not necessarily limited thereto, embodiments discussed in this context can facilitate an understanding of various aspects of the disclosure. Certain embodiments may also be directed towards other equipment and associated applications, such as providing structurally flexible, cost-effective ambipolar FET devices to electronic equipment such as flexible and/or wearable electronic devices, which may be used in a wide variety of personal and health-related applications. Such devices may include, but are not limited to personal communication and health monitoring devices and other types of special-purpose electronics. Embodiments may also be directed towards medical devices and sensors to facilitate monitoring of physiological functions and indicators (e.g., blood pressure, pulse rate).

A unipolar field-effect transistor (FET), for example, an N-channel FET (NFET) or a P-channel FET (PFET) may be operated by applying a gate-source voltage ($V_{GS}$) between source (S) and gate (G) terminals. For example, applying a positive $V_{GS}$ to an NFET device may allow a current of NFET majority carriers (electrons) to flow from the NFET's source terminal to its drain terminal. Similarly, applying a negative $V_{GS}$ to a PFET device may allow a current of PFET majority carriers (holes) to flow from the PFET's source terminal to its drain terminal.

Generally, each type of unipolar FET (NFET and PFET) may respond by allowing current to flow from its source terminal to its drain terminal in response to only one polarity (positive or negative) of $V_{GS}$; application of a $V_{GS}$ of the opposite polarity to the unipolar device may not produce an appreciable source-drain current flow.

An ambipolar FET device may generally be operated in N-channel and P-channel "modes" and may be used to replace both and an N-channel and a P-channel FET in certain applications. An ambipolar FET may respond to the application of either a positive or a negative $V_{GS}$ polarity by allowing a current to flow from one of the FET's source/drain terminals to the other one of the FET's source/drain terminals. A $V_{GS}$ of one polarity may enable current flow in one direction between source/drain terminals, and a $V_{GS}$ of the opposite polarity may enable current flow in an opposite direction. For simplicity of discussion, the "drain" and "source" terminals will be referred to herein simply as "contacts".

Thin-film crystalline inorganic ambipolar FET devices may be useful in providing relatively low-cost, high-performance digital switching devices for flexible and/or large area electronic applications such as flat-panel displays, wearable computing devices and medical devices. A crystalline structure of an ambipolar FET may have a higher carrier mobility than other types of switching devices, such as organic or amorphous FETs, that are used for flexible and/or large area electronic applications. A high carrier mobility may result in robust FET performance, especially at high device operating frequencies. The use of thin films in ambipolar FET manufacturing may result in flexible FET devices that may be flexed without damage or disruption to electrically active layers. Ambipolar FET devices may be fabricated using a smaller number of masks and process operations than to the number used for devices including two unipolar (e.g., N-channel and P-channel) FET types. Limiting the number of masks and process operations used may limit fabrication costs for devices employing ambipolar FETs, and may provide a cost advantage for ambipolar FET technology.

Certain embodiments relate to the fabrication of inorganic crystalline ambipolar logic FETs. FIG. 1 depicts a cross-sectional view 100 of two field-effect transistors (FETs) 102, 104 formed on a handle substrate layer 116 and configured to provide ambipolar functionality in response to an input voltage applied to the $V_{IN}$ terminal connected to gate layers 122A, 122B, according to embodiments of the present disclosure. The thin-film inorganic crystalline FETs 102, 104 may both be manufactured using a common set of process operations, and may be useful in certain applications as structurally flexible FETs with ambipolar characteristics. Ambipolar FETs 102, 104 may be a useful and cost-effective replacement for unipolar (e.g., N-channel and P-channel) FETs in certain applications involving large area, structurally flexible electronic devices. Ambipolar FETs 102, 104 may have higher channel region mobility and higher performance than large area, flexible FETs manufactured with organic or amorphous materials.

Each FET (102, 104) may include an inorganic crystalline layer (114A, 114B, respectively) formed on a top of the handle substrate layer 116. Contacts (124A, 124B and 124C, 124D, respectively) and dielectric layers (120A, 120B, respectively) may be formed on and attached to the top surface of the inorganic crystalline layers (114A, 114B, respectively). Dielectric layers (120A, 120B, respectively) may be formed between the respective first and second contacts (124A, 124B and 124C, 124D). Gates (122A, 122B) may be formed on a top surface of the dielectric layers (120A, 120B, respectively).

FETs 102 and 104 are depicted in FIG. 1 as configured to form an inverter, with the FETs having a common "drain" connection (contacts 124B, 124C) of $V_{OUT}$, a common gate connection to $V_{IN}$, and contacts 124A connected to a supply voltage, $V_{DD}$, and contact 124D connected to GND. In certain embodiments, additional ambipolar FET devices may be configured to form logic functions such as gates (e.g., AND, NAND, OR, NOR) and data storage functions such as latches, flip-flops and registers.

In certain embodiments the handle substrate layer 116 may be electrically insulative, and may include an undoped semiconductor material such as crystalline silicon. Handle substrate layer 116 may be a structurally flexible material such as plastic, commercial photo paper or ultra-thin (i.e., 100 μm) flexible glass. According to embodiments, the thickness of the handle substrate layer 116 may not affect the electrical performance of FETs 102, 104.

In embodiments the inorganic crystalline layers (114A, 114B) may include single-crystalline (mono-crystalline) elements such as (predominantly) silicon, germanium or silicon-germanium. The inorganic crystalline layers (114A, 114B) may include greater than 50% crystalline elements such as silicon and germanium, in combination with a relatively small portion (generally less than 1 percent) of impurities and other elements used as dopants (e.g., boron, arsenic and phosphorus). For example, in certain embodiments, substantially all of the crystalline material, or greater than 99%, may be crystalline elements. In particular embodiments greater than 99.5% of crystalline material may be crystalline elements.

In certain embodiments the crystalline layers (114A, 114B) may include poly-crystalline (multi-crystalline) materials. According to embodiments, a thickness of the inorganic crystalline layers (114A, 114B) may be between 5 nm and 500 nm. The mobility of the channel region formed in crystalline layer 114 may be in a range between 5 cm²/Vs and 500 cm²/Vs, consistent with mobilities of unipolar (N-channel and P-channel) FET devices.

Application of a (first or second) gate voltage ($V_{GS}$) to a gate layer (e.g., 122A), may result in the formation of a conductive channel region within a corresponding inorganic crystalline layer (e.g. 114A) which may allow current to be conducted along the length of the channel region between (first and second) contacts (e.g., 124A, 124B). The conductive channel region may have a length extending between a first contact (e.g. 124A) and a second contact (e.g. 124B), and may be formed in a portion of the crystalline layer (e.g. 114A) adjacent to the contacts (e.g., 124A, 124B). In embodiments, a first (e.g., positive) gate voltage ($V_{GS}$) may cause a current of electrons to flow between the contacts (e.g., 124A, 124B), and second (e.g., negative) gate voltage ($V_{GS}$) may cause a current of holes to flow between the contacts (e.g., 124A, 124B).

Thin-film crystalline layers (e.g., 114 A) of materials such as silicon, having thicknesses in a range between 5 nm and 20 μm may be flexible, i.e., able to be flexed without causing structural damage that may alter the electrical characteristics/performance of the layer. The entire FET layer structure (device) of embodiments including a flexible thin-film crystalline layer (e.g., 114A) formed on, or transferred to, a flexible handle substrate layer 116, may be flexible.

Contacts 124A-124D may be formed from a metal or other electrically conductive material on a top surface of a dielectric layer (e.g. 120A). In certain embodiments, the (first and second) contacts may include a metal with a work function within a range of +/−25% of an intrinsic Fermi energy of the channel region within the inorganic crystalline layer (e.g., 114A). In certain embodiments the (first and second) contacts may include a metal with a work function between 4.2 electron volts (eV) and 4.8 eV, which may include chromium.

The dielectric layers (120A, 120B) may include "high-κ" dielectric material having a dielectric constant between 3.9 and 25. The high-κ dielectric layers (120A, 120B) may be useful in limiting current leakage (and resulting power consumption) between the gate layer (122A, 122B) and the crystalline layers 114A, 114B. Dielectric layers (120A, 120B) may include materials such as hafnium silicate, zirconium silicate, hafnium dioxide and zirconium dioxide, which may be deposited using atomic layer deposition. Gates 122A, 122B may be formed from a metal or other electrically conductive material on a top surface of a dielectric layer (e.g. 120A).

If a first voltage that is low (approximately GND) is applied to $V_{IN}$, both FETs 102 and 104 may operate as P-channel FETs; FET 102 (connected to $V_{DD}$) may operate in a linear mode and FET 104 (connected to GND) may operate in a saturation mode. The resulting voltage drop across FET 102 may be relatively small, as a larger proportion of the voltage drop is realized across FET 104, and the resulting output voltage ($V_{OUT}$) may be high (approximately $V_{DD}$).

If a second voltage that is high (approximately $V_{DD}$) is applied to $V_{IN}$, both FETs 102 and 104 may operate as N-channel FETs; FET 104 may operate in the linear mode and FET 102 may operate in a saturation mode. The resulting voltage drop across FET 104 may be relatively small, as a larger proportion of the voltage drop is realized across FET 102, and the resulting output voltage ($V_{OUT}$) may be low (approximately GND).

Figure 2:
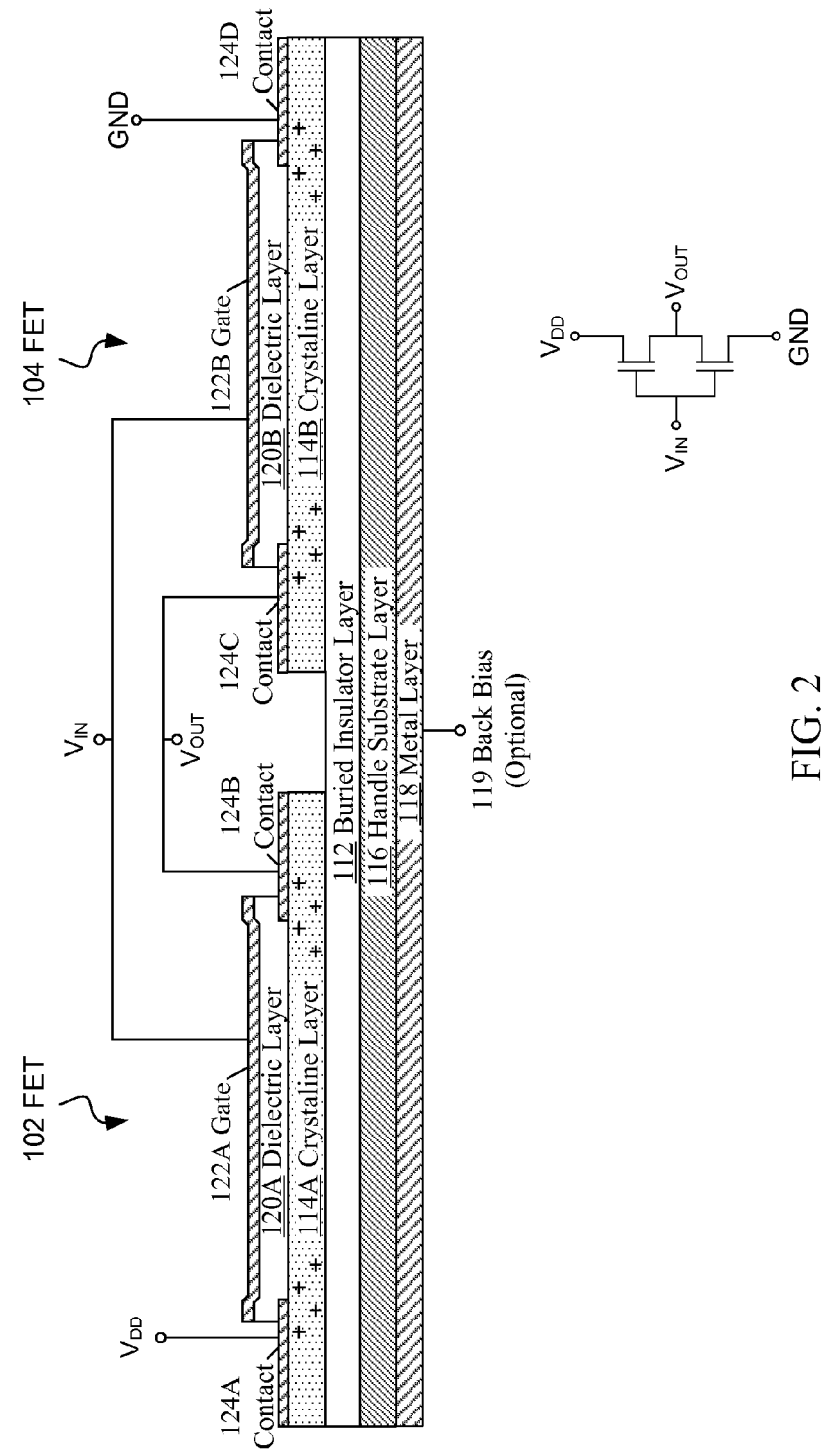
FIG. 2 depicts a cross-sectional view of two ambipolar FETs formed on a buried insulator layer and configured to be controlled by a gate voltage applied to a gate layer, according to embodiments of the present disclosure.

FIG. 2 depicts a cross-sectional view 200 of two field-effect transistors (FETs) 102, 104 formed on a buried insulator layer 112 and configured to provide ambipolar functionality in response to a gate voltage $V_{IN}$ applied to gate layers 122A, 122B, according to embodiments of the present disclosure consistent with FIG. 1. The structure, functionality, applications and manufacturing process of FETs 102, 104 of FIG. 2 are generally consistent with those of FETs 102, 104 of FIG. 1.

In certain embodiments, the inorganic crystalline layers (114A, 114B) of FETs 102, 104 may be formed on or transferred to the top of a buried insulator layer 112. The buried insulator layer 112 may be formed on a top surface of a handle substrate layer 116. Buried insulator layer 112 may be useful to electrically insulate an electrically conductive handle substrate layer 116 and/or a metal layer 118 from crystalline layers (e.g., 114A, 114B) of FETs 102, 104. In embodiments, the buried insulator layer 112 may include a buried oxide (BOX) layer, such as silicon dioxide (Sift), or various high-κ dielectrics such as silicon nitride, aluminum oxide and hafnium oxide. In embodiments, a thickness of buried insulator layer 112 may range from 5 nm to 500 nm. In certain embodiments, a thicker or thinner buried insulator layer 112 may be used.

In embodiments, the handle substrate layer 116 may be a structurally flexible and highly electrically conductive material (e.g., a highly doped semiconductor such as silicon) or a deposited metal layer or metallic foil.

In certain embodiments, metal layer 118 may be formed or attached to a bottom surface of handle substrate layer 116. In embodiments that include a highly conductive handle substrate layer 116, metal layer 118 may not be included as part of the structure of FETs 102, 104. The metal layer 118 or highly conductive handle substrate layer 116 may be configured to, in response to a back bias voltage applied to the back bias 119 terminal, modify a (first) conductivity of the channel region of the (first) FET 102 and modify a (second) conductivity of the channel region of the (second) FET 102. A back bias voltage suitable for modifying FET channel conductivity may scale with a thickness of the buried insulator layer 112. For example, as a thickness of buried insulator layer 112 is increased, a greater back bias voltage may be applied to terminal 119 to obtain a specified FET channel conductivity. Modifying FET conductivity may be useful in adjusting, tuning or enhancing ambipolar FET performance characteristics. In particular, modifying the FET channel conductivity may be useful in adjusting the threshold voltage of the FET.

Figure 3:
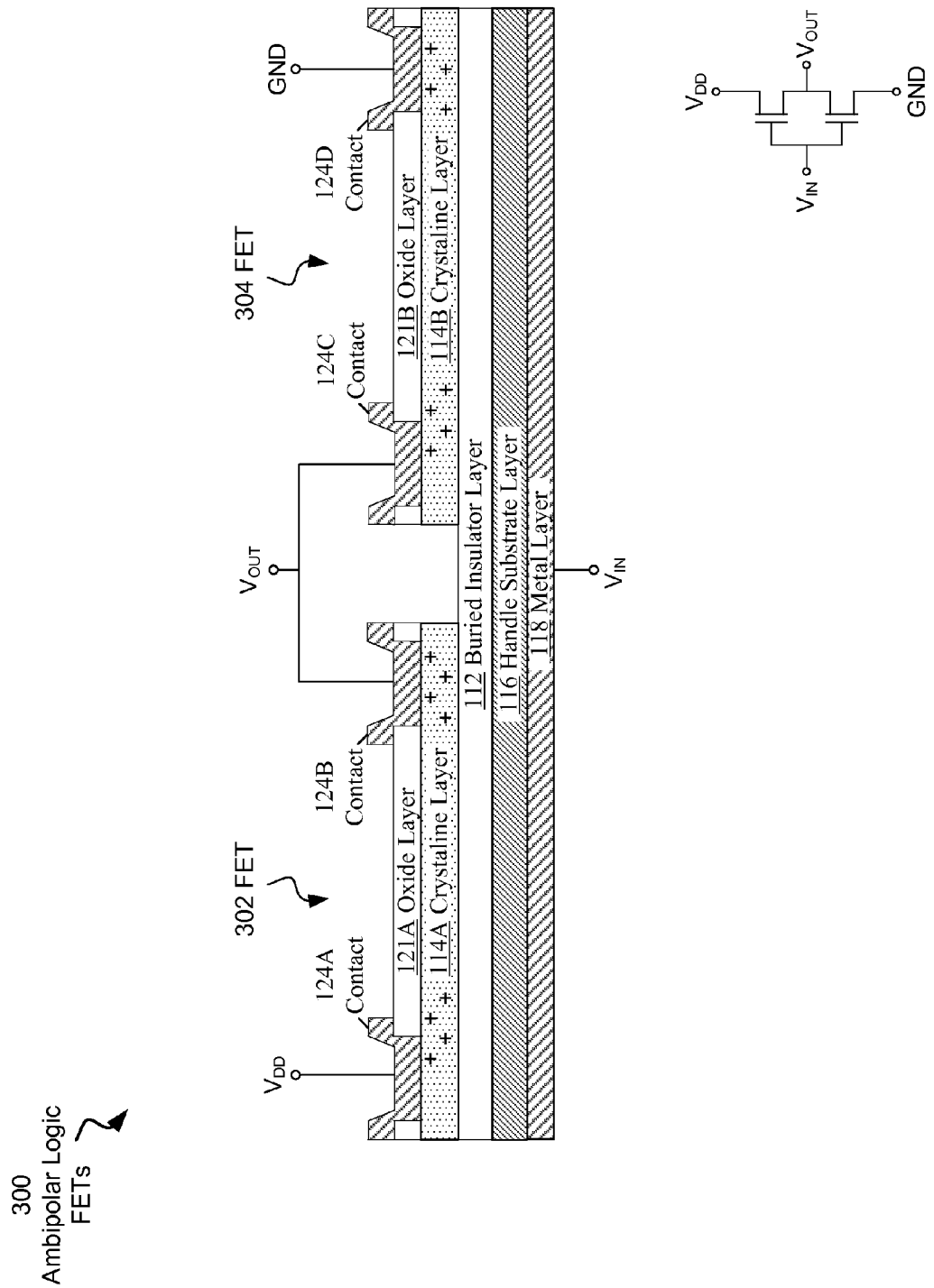
FIG. 3 depicts a cross-sectional view of two ambipolar FETs formed on a buried insulator layer and configured to be controlled by a gate voltage applied to a metal layer, according to embodiments of the present disclosure.

FIG. 3 depicts a cross-sectional view 300 of two field-effect transistors (FETs) 302, 304 formed on a buried insulator layer 112 and configured to provide ambipolar functionality in response to a gate voltage applied to the $V_{IN}$ terminal (connected to metal layer 118), according to embodiments of the present disclosure generally consistent with FIG. 2. The structure, applications and manufacturing process of FETs 302, 304 of FIG. 3 are generally consistent with those of FETs 102, 104 of FIG. 2.

Oxide (insulating) layers (e.g., 121A, 121B) may be formed or grown, between a (first) contact and a (second) contact (e.g., 124A, 124B, respectively), on a top surface and inorganic crystalline layer (e.g., 114A).

In certain embodiments, the inorganic crystalline layers (114A, 114B) of FETs 102, 104 may be formed on or transferred to the top of a buried insulator layer 112. The buried insulator layer 112 may be formed between a top surface of a handle substrate layer 116 and the inorganic crystalline layers (114A, 114B). Buried insulator layer 112 may be useful to electrically insulate a handle substrate layer and/or a metal layer from crystalline layers (e.g., 114A, 114B) of FETs 302, 304. In embodiments, the buried insulator layer may include a buried oxide (BOX) layer, such as silicon dioxide ($SiO_2$), or various high-κ dielectrics such as silicon nitride, aluminum oxide and hafnium oxide. In embodiments, a thickness of buried insulator layer 112 may range from 5 nm to 500 nm. In certain embodiments, a thicker or thinner buried insulator layer 112 may be used.

In embodiments, the handle substrate layer 116 may be a structurally flexible and highly electrically conductive material (e.g., a highly doped semiconductor such as silicon) or a deposited metal layer or metallic foil.

In certain embodiments, metal layer 118 may be included as part of the structure of FETs 102, 104. In embodiments that include a highly conductive handle substrate layer 116, metal layer 118 may not be attached to the bottom of handle substrate layer 116. The metal layer 118 or highly conductive handle substrate layer 116 may be configured to, in response to the application of a (first or second) gate voltage to the $V_{IN}$ terminal, form conductive channel regions within the inorganic crystalline layers (e.g. 114A, 114B).

Forming conductive channel regions may allow current to be conducted along the length of the channel region between (first and second) contacts (e.g., 124A, 124B or 124C, 124D). The conductive channel region may have a length extending between a first contact (e.g. 124A) and a second contact (e.g. 124B), and may be formed in a portion of the crystalline layer (e.g. 114A) adjacent to the buried insulator layer 112. In embodiments, a first (e.g., positive) gate voltage applied to the $V_{GS}$ terminal may cause a current of electrons to flow between the contacts (e.g., 124A, 124B), and second (e.g., negative) gate voltage ($V_{GS}$) may cause a current of holes to flow between the contacts (e.g., 124A, 124B).

An input voltage suitable for forming conductive channel regions within a crystalline layer may scale with a thickness of the buried insulator layer 112. For example, as a thickness of buried insulator layer 112 is increased, a greater input voltage may be applied to terminal $V_{IN}$ to obtain a specified channel conductivity, or current flow between contacts (e.g., 124A, 124B).

Figure 4:
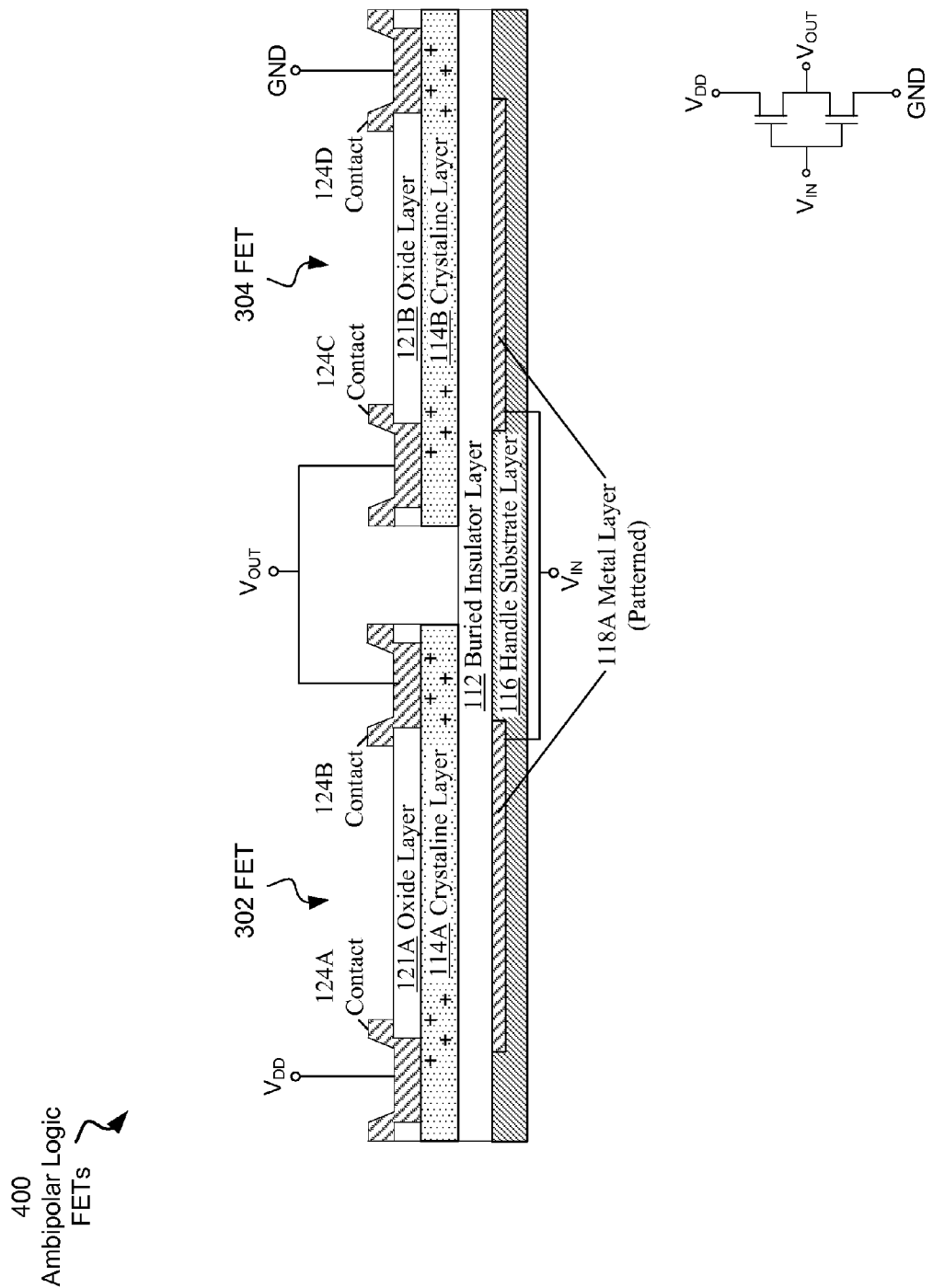
FIG. 4 depicts a cross-sectional view of two ambipolar FETs formed on a buried insulator layer and configured to be controlled by a gate voltage applied to a patterned metal layer, according to embodiments of the present disclosure.

FIG. 4 depicts a cross-sectional view 400 of two field-effect transistors (FETs) 302, 304 formed on a buried insulator layer 112 and configured to provide ambipolar functionality in response to a gate voltage applied to a $V_{IN}$ terminal connected to a patterned metal layer 118A, according to embodiments of the present disclosure generally consistent with FIG. 3. The structure, applications and manufacturing process of FETs 302, 304 of FIG. 3 are generally consistent with those of FETs 302, 304 of FIG. 3.

Buried insulator layer 112 may be formed between a top surface of a handle substrate layer 116, a top surface of the patterned metal layer 118A and the inorganic crystalline layers (114A, 114B). Buried insulator layer 112 may be useful to electrically insulate the patterned metal layer 118A from crystalline layers (e.g., 114A, 114B) of FETs 302, 304.

In embodiments, the handle substrate layer 116 may be a structurally flexible and electrically insulative material such as plastic, commercial photo paper or ultra-thin (i.e., 100 μm) flexible glass.

In certain embodiments, patterned metal layer 118A may be formed on or attached to a bottom surface of buried insulator layer 112, and handle substrate layer 116 may be subsequently formed on bottom surfaces of both buried insulator layer 112 and patterned metal layer 118A. In certain embodiments, the patterned metal layer 118A may be patterned to overlap a channel region formed in a crystalline layer (e.g., 114A), between the (first) contact and the (second) contact (e.g., 124A, 124B), respectively.

Patterning of metal layer 118A may reduce a spatial overlap, and resulting capacitance between the patterned metal layer 118A (which may act as a FET gate) and the contacts (e.g., 124A, 124B or 124C, 124D), which may improve high-frequency response of FET 302 or 304, respectively. In certain embodiments, patterned metal layer 118A may overlap the contacts (e.g., 124A, 124B), to increase conductivity of a channel regions within the inorganic crystalline layers (e.g. 114A, 114B).

In certain embodiments, patterned metal layer 118A may not overlap the contacts (e.g., 124A, 124B), in order to increase the high-frequency response of FET 302 or 304. In embodiments, voltage terminal $V_{IN}$ may be connected to patterned metal layer 118A through an insulated via or other connecting structure. The patterned metal layer 118A may be configured to, in response to the application of a (first or second) gate voltage to the $V_{IN}$ terminal, form a conductive channel region within each of the inorganic crystalline layers (e.g. 114A, 114B).

An input voltage suitable for forming conductive channel regions within a crystalline layer may scale with a thickness of the buried insulator layer 112. For example, as a thickness of buried insulator layer 112 is increased, a greater input voltage may be applied to terminal $V_{IN}$ to obtain a specified channel conductivity, or current flow between contacts (e.g., 124A, 124B).

Figure 5:
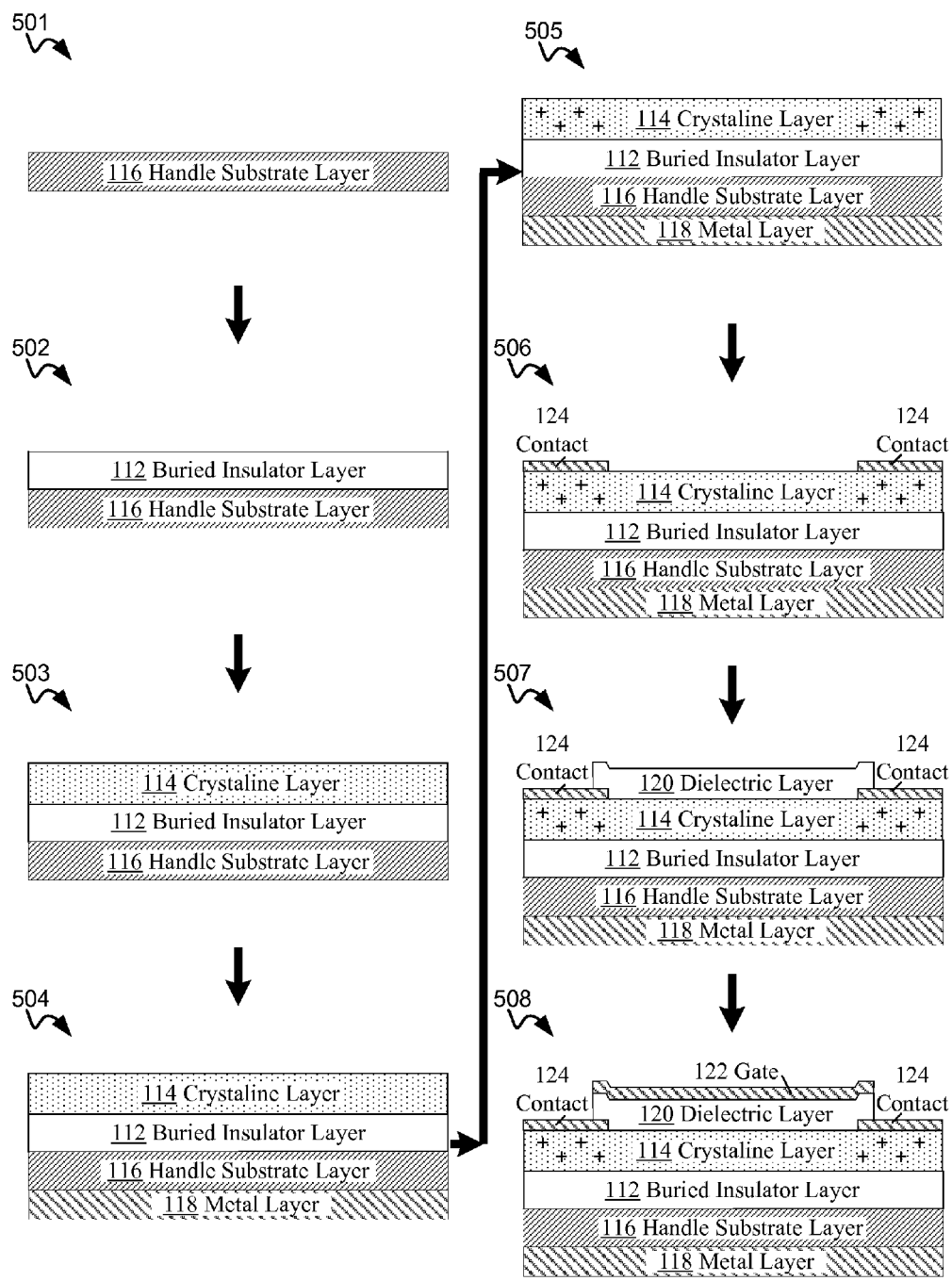
FIG. 5 includes eight cross-sectional views illustrating the results of process steps for fabricating ambipolar logic FETs, according to embodiments.

FIG. 5 includes eight cross-sectional views (501 through 508) illustrating the results of a sequential set of process steps for manufacturing an ambipolar logic field-effect transistor (FET) device (e.g., 102, 104, FIG. 1), according to embodiments of the present disclosure consistent with the figures. These views illustrate an example process; other views and steps may be possible.

The results of one or more process steps may be depicted in each view. For example, a view may depict the results of growing a contact layer (e.g., 124), which may include related photo masking, exposure and etching steps. Processing steps associated with views 501 through 508 may include, but are not limited to metallic deposition, layer growth, layer deposition, layer separation, layer transfer, and doping of crystalline structures.

The progression depicted in views 501 through 508 begins with a handle substrate layer 116 (view 501) and ends with a completed ambipolar FET device (view 508). For simplicity of illustration, completed structures are generally shown in the views as having rectangular cross-sectional profiles, with surfaces orthogonal to each other. This depiction, however, is not limiting; structures may be of any suitable shape, size and profile, in accordance with specific design criteria, lithographic and manufacturing process limitations and tolerances for a given application. For example, corners shown as having right angles may be rounded, surfaces may have a non-orthogonal relative orientation, and relative dimensional ratios may vary from those depicted in the figures. Views 501 through 508 illustrate the process of manufacturing a single ambipolar FET device, however, in embodiments, a plurality of FETs may be simultaneously manufactured on the same handle substrate layer 116.

View 501 depicts a handle substrate layer 116, having a generally planar shape and top and bottom surfaces. The handle substrate layer 116 may be a relatively cost-effective, thin and flexible material such as plastic or metal foil. In certain embodiments, handle substrate layer 116 may be electrically insulative, and in particular embodiments handle substrate layer 116 may be electrically conductive.

View 502 depicts the result of forming a buried insulator layer 112 on the top surface of handle substrate layer 116. In certain embodiments, the buried insulator layer 112 may be a buried oxide (BOX) such as silicon dioxide (Sift). In certain embodiments, the buried insulator layer may be a "high-κ" dielectric material, such as hafnium silicate, zirconium silicate, hafnium dioxide and zirconium dioxide, which may be deposited using atomic layer deposition. The buried insulator layer 112 may be useful for electrically insulating a crystalline layer from a layer which may be conductive, such as a handle substrate layer or metal layer, which may be formed on a bottom surface of the buried insulator layer 112.

View 503 depicts the result of forming a thin crystalline layer 114 on, or transferring a thin crystalline layer 114 to, the top surface of the buried insulator layer 112.

In certain embodiments the thin-film inorganic crystalline layer 114 may be grown on a crystalline host substrate. In embodiments the host substrate may be an inorganic, elemental semiconductor such as silicon, and in certain embodiments the host substrate may include an inorganic semiconductors such III-V and II-IV elements. In certain embodiments, thin-film crystalline layer 114 may be a mono-crystalline structure.

Following the growth of the thin-film crystalline layer 114, layer 114 may then be separated from the crystalline host substrate using layer transfer techniques which may include but are not limited to a controlled spalling process, an epitaxial layer lift-off process, and a smart-cut process. The thin crystalline layer 114 may then be bonded onto the buried insulator layer 112 using known bonding techniques such as direct (chemical) bonding, eutectic bonding, adhesive bonding or plasma activated bonding.

In particular embodiments, a thin, inorganic, non-crystalline layer (e.g., 114) may be deposited on the top surface of the buried insulator layer 112. The non-crystalline layer may be subsequently crystallized using a crystallization technique which may include, but is not be limited to, laser crystallization, solid-phase crystallization and metal-induced crystallization. In certain embodiments a crystalline layer 114 may be deposited on the buried insulator layer 112 using a chemical vapor deposition (CVD) technique. In certain embodiments, thin-film crystalline layer 114 may be a multi-crystalline structure.

View 504 depicts the result of depositing a metal layer 118 on a bottom surface of the handle substrate layer 116. According to embodiments, metallic layer 118 may be a deposited (electroplated or sputtered) metal such as aluminum, or may be a foil layer attached to handle substrate layer 116, for example, by thermal bonding or adhesives. Metal layer 118 may be useful for back biasing or acting as a gate structure for an ambipolar FET device.

View 505 depicts the result of doping the crystalline layer 114. In certain embodiments, crystalline layer 114 may be doped during its formation, before growth on or transfer to buried insulator layer 112, as depicted in view 503. In certain embodiments the crystalline layer 114 may be doped prior to view 505. Dopants may include P type (e.g., boron, gallium) or N type (e.g., phosphorus, arsenic) elements, and may be diffused into the crystalline layer 114 with a concentration sufficient to allow a conductive channel to be created, in the presence of a gate voltage on a gate layer, in the crystalline layer 114.

View 506 depicts the result of forming contacts 124 on a top surface of the inorganic crystalline layer 114. First and second electrically conductive contacts 124 may be fabricated from metal or another electrically conductive material. In certain embodiments, the forming of contacts 124 may include hydrogen termination of the top surface of the inorganic crystalline layer 114 and a metal evaporation process performed in a vacuum chamber. In particular embodiments the contacts 124 may include chromium.

Contacts 124 may be connected to a voltage or current source and may be used to inject carriers (electrons or holes) into the channel region in the crystalline layer 114, which may then flow from (a first) contact 124, through the channel region, to (a second) contact 124.

View 507 depicts the result of depositing a dielectric layer 120 the top surface of the inorganic crystalline layer 114, between the contacts 124. Dielectric layer 120 may include "high-κ" dielectric materials, which may have a dielectric constant between 3.9 and 25, and which may be useful in limiting current leakage (and resulting power consumption) between a gate layer and the crystalline layer 114. Dielectric layer 120 may include materials such as hafnium silicate, zirconium silicate, hafnium dioxide and zirconium dioxide, which may be deposited using atomic layer deposition.

View 508 depicts the result of depositing, on a top surface of the dielectric layer 120, and between the (first) electrically conductive contact and the (second) electrically conductive contact, an electrically conductive material, to form a gate layer 122. Application of a (first) gate voltage to the gate layer 122 may cause a current of electrons, as a majority carrier, to be conducted, along a length of a channel region between the first contact and the second contact. Application of a (second) gate voltage to the gate layer 122 may cause a current of holes, as a majority carrier, to be conducted, along a length of a channel region between the first contact and the second contact.

Specified and actual finished dimensions of structures depicted in views 501 through 508 may be generally constrained by design needs, manufacturing and process tolerances, and availability of materials having certain dimensions.

Figure 6:
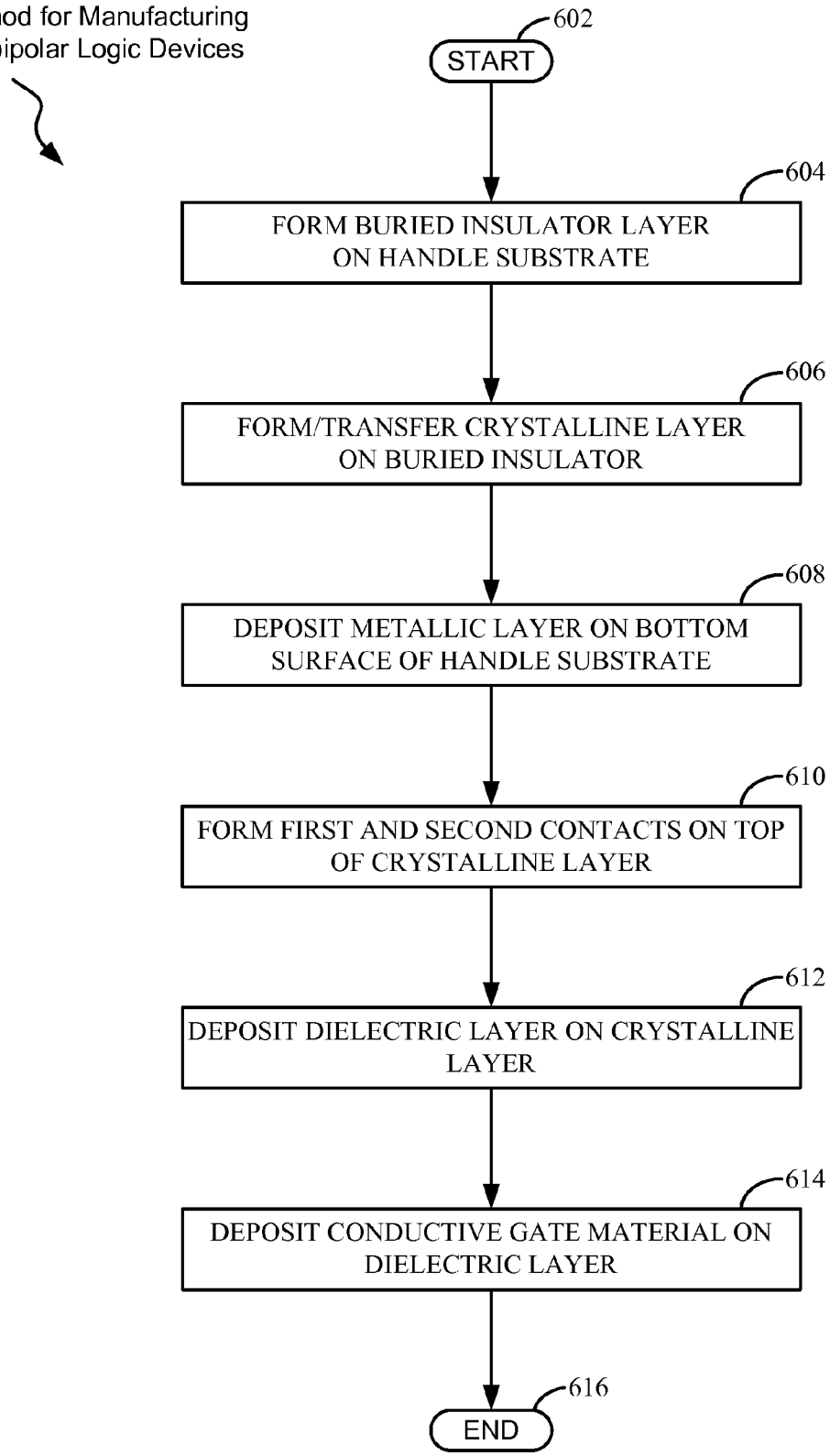
FIG. 6 is a flow diagram illustrating steps for manufacturing ambipolar logic devices, according to embodiments.

FIG. 6 is a flow diagram illustrating steps for manufacturing ambipolar logic devices 600, according to embodiments consistent with the figures. The method for manufacturing ambipolar logic devices 600 may be useful for providing a cost-effective process for creating inorganic thin-film flexible electronic devices on a flexible substrate. The process 600 moves from start 602 to operation 604.

Operation 604 generally refers to the process steps that involve forming a buried insulator layer on a handle substrate, which may correspond to the view provided by 502 (FIG. 5) and its associated description. A buried insulator layer may be used to electrically insulate a crystalline layer from a conductive handle substrate layer or a metal layer. The buried insulator layer may include a buried oxide (BOX) such as silicon dioxide ($SiO_2$) or a high-κ dielectric material. A buried insulator layer may be formed or deposited by processes including oxidation of an existing layer, such as crystalline silicon, or atomic layer deposition (ALD). Once a buried insulator layer (112, view 505) has been formed on a handle substrate, the process moves to operation 606.

Operation 606 generally refers to the process steps that involve forming a crystalline layer (114, view 503) on, or transferring a crystalline layer to, the buried insulator layer (112, view 503), which may correspond to the views provided by 503 (FIG. 5) and their associated descriptions. In certain embodiments a thin crystalline layer may be transferred from a host substrate onto the buried insulator layer (112, view 503). In certain embodiments a non-crystalline material may be deposited onto the buried insulator and subsequently crystallized as described in reference to view 503, FIG. 5. In certain embodiments, the host substrate may be chosen to have a sufficient level of doping so that no additional doping is necessary after the layer transfer operation. Once a crystalline layer has been formed on or transferred to the buried insulator layer, the process moves to operation 608.

Operation 608 generally refers to the process steps that involve depositing a metallic layer on a bottom surface of the handle substrate, which may correspond to the views provided by 504, 505 (FIG. 5) and their associated descriptions. In certain embodiments, a metallic layer may be useful as a gate structure (layer) to control current flow between contacts of an ambipolar FET device. In certain embodiments, a metallic layer may be useful as an electrical structure through which to apply an electric field to back bias (adjust operating characteristics of) an ambipolar FET device. In certain embodiments, a patterned metallic layer may be deposited between the handle substrate layer and the buried insulator layer, and used as a gate structure to control an ambipolar FET device. Once the metallic layer has been deposited on the bottom surface of the handle substrate, the process moves to operation 610.

Operation 610 generally refers to the process steps that involve forming a first and a second contact on the top surface of the crystalline layer, which may correspond to the views provided by 506 (FIG. 5) and their associated descriptions. Contacts may be formed by evaporating, in a vacuum, a metal which is then deposited in contact areas. The top surface of the inorganic crystalline layer may be prepared for contact forming through a process of hydrogen termination. In certain embodiments, the contacts may include chromium. Once a first and a second contact have been formed, the process moves to operation 612.

Operation 612 generally refers to the process steps that involve depositing a dielectric layer onto the crystalline layer, which may correspond to the views provided by 507 (FIG. 5) and their associated descriptions. A dielectric layer may be used to electrically insulate a crystalline layer from a gate layer and may include a buried oxide (BOX) such as silicon dioxide ($SiO_2$) or a high-κ dielectric material. A dielectric layer may be formed or deposited by processes including oxidation of an existing layer, such as crystalline silicon, or atomic layer deposition (ALD). Once the dielectric layer has been deposited on the crystalline layer, the process moves to operation 614.

Operation 614 generally refers to the process steps that involve depositing a conductive gate material on the dielectric layer, which may correspond to the views provided by 508 (FIG. 5) and their associated descriptions. The gate material may include a metal or other electrically conductive material which is chemically and electrically compatible with the dielectric material. The gate may be formed by evaporating, in a vacuum, a metal which is then deposited on top of the dielectric layer. Once a conductive gate material has been deposited on the dielectric layer, the process 600 may end at block 616.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for manufacturing an ambipolar FET (field-effect transistor) device, the method comprising:
    forming a buried insulator layer on a handle substrate layer;
    forming an inorganic crystalline layer on the buried insulator layer;
    depositing a metallic layer on a bottom surface of the handle substrate layer;
    forming a first electrically conductive contact and a second electrically conductive contact on a top surface of the inorganic crystalline layer;
    depositing a dielectric layer on a top surface of the inorganic crystalline layer; and
    depositing an electrically conductive material between the first electrically conductive contact and the second electrically conductive contact, to form a metal layer that is configured to function as a gate of the ambipolar FET by:
        causing, in response to a first gate voltage and using electrons as a majority carrier, current to be conducted, along a length of a channel region between a first contact and a second contact; and
        causing, in response to a second gate voltage and using holes as a majority carrier, current to be conducted, along the length of the channel region between the first contact and the second contact.

2. The method of claim 1, wherein forming an inorganic crystalline layer on the buried insulator layer includes depositing a non-crystalline material layer onto the buried insulator layer and subsequently crystallizing the non-crystalline material layer.

3. The method of claim 1, wherein forming an inorganic crystalline layer on the buried insulator layer includes transferring an inorganic crystalline layer from a host substrate onto the handle substrate layer.

4. The method of claim 1, wherein forming a first electrically conductive contact and a second electrically conductive contact includes hydrogen termination of the top surface of the inorganic crystalline layer.

5. The method of claim 4, wherein forming a first electrically conductive contact and a second electrically conductive contact involves a metal evaporation process performed in a vacuum chamber.

* * * * *